US006597579B1

(12) United States Patent
Reszat et al.

(10) Patent No.: US 6,597,579 B1
(45) Date of Patent: Jul. 22, 2003

(54) CONTROL DEVICE FOR ELECTROHYDRAULIC MINING CONTROLLERS

(75) Inventors: Martin Reszat, Lünen (DE); Johannes Wesselmann, Dortmund (DE); Jürgen Tschöpe, Selm (DE)

(73) Assignee: DBT Automation GmbH (DE)

( * ) Notice: Subject to any disclaimer, the term of this patent is extended or adjusted under 35 U.S.C. 154(b) by 0 days.

(21) Appl. No.: 09/589,025

(22) Filed: Jun. 7, 2000

(30) Foreign Application Priority Data

Jun. 7, 1999 (DE) ........................................ 199 25 738

(51) Int. Cl.[7] ................................................ H05K 5/00

(52) U.S. Cl. ........................ 361/731; 361/680; 361/681; 361/727; 439/502; 439/928

(58) Field of Search ................................ 361/731, 680, 361/681, 729, 683, 730, 679, 725–727, 733; 439/949, 76.2, 502, 928

(56) References Cited

U.S. PATENT DOCUMENTS

| | | | | |
|---|---|---|---|---|
| 3,014,160 A | * 12/1961 | Brogden | ..................... | 361/727 |
| 4,527,285 A | * 7/1985 | Kekas et al. | ................ | 359/152 |
| 4,658,375 A | * 4/1987 | Onogi et al. | .................... | 710/2 |
| 5,031,074 A | * 7/1991 | Ravid | ......................... | 361/683 |
| 5,493,194 A | * 2/1996 | Damiano et al. | ........... | 318/575 |
| 5,655,915 A | * 8/1997 | McMills et al. | ............ | 439/133 |
| 5,703,754 A | * 12/1997 | Hinze | ......................... | 361/736 |
| 6,008,985 A | * 12/1999 | Lake et al. | ................. | 361/686 |
| 6,076,124 A | * 6/2000 | Korowitz et al. | ........... | 710/102 |
| 6,172,875 B1 | * 1/2001 | Suzuki et al. | ............... | 361/729 |
| 6,181,549 B1 | * 1/2001 | Mills et al. | ................. | 361/683 |

FOREIGN PATENT DOCUMENTS

| | | |
|---|---|---|
| DE | 197 51 007 A 1 | 5/1999 |
| GB | 1 212 184 | 11/1970 |
| GB | 2 203 601 A | 10/1988 |
| GB | 2 225 172 A | 5/1990 |
| WO | WO 84/01256 | 3/1984 |

* cited by examiner

*Primary Examiner*—David Martin
*Assistant Examiner*—Hung Bui
(74) *Attorney, Agent, or Firm*—Cook, Alex, McFarron, Manzo, Cummings & Mehler, Ltd.

(57) ABSTRACT

A control device (10) for electro-hydraulic support frames with a casing (11) accommodating a circuit, several plug-in connectors (20) accessible from outside the casing (11) for the connection of control leads, and with actuating control elements (13) connected to the circuit. The control elements (14, 15, 16, 17, 18) are grouped together in several exchangeable modules (27), accommodated in the casing (11), which are connected to the circuit and to each other by plug-in connecting elements (30) when installed in the casing (11). The modules (27) are exchangeable independently of each other. The operating keys of a keyboard (16) and/or an indicator unit (18) can be combined in one operating module (28), which can be removed from the casing (11). The actual control of the control device in the casing (11) and operation of the support frame is permitted to continue during the exchange of the operating module (28).

16 Claims, 3 Drawing Sheets

CONTROL DEVICE FOR ELECTROHYDRAULIC MINING CONTROLLERS

BACKGROUND OF THE INVENTION

The present invention relates to a control device for electro-hydraulic support control, with a casing accommodating the electrical and/or electronic circuit of the control device, several plug connectors accessible from the outside of the casing for the connection of control leads for the components of the support to be controlled, and with actuating control elements connected to the circuit.

Control devices of this construction for electro-hydraulic face support control gear are assigned to individual support frames of an underground face operation. Connecting leads for a power supply, for data transmission to the control devices of neighbouring support frames and/or to a central computer, for the feeding in of electrical signals from sensors, and for the actuation of circuits for eletromagnetic valves are connected onto the plug connectors from the individual controllers.

A control device of this construction is known from DE-A-197 51 007, in which a sensitive circuit is configured in the form of a circuit board which carries the plug connectors, and which is accommodated in a receiving compartment formed within the casing and sealed off from the actuating control elements, and encapsulated on all sides by a cast block, so that dirt and moisture present underground cannot penetrate to the sensitive circuit, and also the plug connectors are integrated firmly against dirt and moisture in the cast block.

The protection of the circuit and the plug connectors in this previously proposed control device has proved itself very effective, so that the lifetime of the circuit can be substantially increased as against older constructions (DE-A-37 08 902, DE-A-35 33 659). This has, however the consequence that if other parts of the control device, namely the actuating control elements, cease to function reliably or at all, because of their frequent, often rough actuation and frictional wear or damage, whilst the most important and also the most expensive part of the control device, namely the electrical or electronic circuit still functions perfectly, it is necessary to completely replace the control device. The replacement of the complete control device is not only expensive, but the expenditure of time in disassembly and re-assembly is comparatively large and the support frame involved cannot operate during the assembly work, so that often the entire face has to be brought to a standstill for the exchange of a single control device.

SUMMARY OF THE INVENTION

It is an aim of the present invention to address one or more of these disadvantages, and to produce a control device of the construction described at the beginning of the specification, which renders unnecessary the complete replacement in the event of the failure or wear of only one of its essential components.

Accordingly, the present invention is directed to a control device as described in the opening paragraph of the present specification in which the activating control elements and/or the circuit of the control device are grouped together and accommodated in the casing in several exchangeable modules, which when assembled in the casing are connected together by means of plug-in connecting elements and which are exchangeable within the casing independently of each other.

In accordance with the invention the control device has a modular construction, in which several different, optimally functioning actuating control elements are contained in separate exchangeable modules, whereby the circuit can also be formed as an exchangeable module, and each exchangeable module can be removed from the casing and exchanged for a new module, without the other modules having to be removed with it or replaced, so that the operation of the support frame or the face equipment need not be interrupted.

In a preferred embodiment a first exchangeable module is configured as an operating module having an operating keyboard, and a second exchangeable module is configured as an emergency cut-out module.

Advantageously the first exchangeable module, in addition to the operating keyboard, has an indicator unit. This allows the various operating conditions of the support frame to be controlled to be displayed. In this configuration, the frequently actuated operating keys are thus collected together into a module in the form of an operating keyboard, whilst an emergency cut-out switch is provided for the individual support frame in a separate module. This configuration makes it possible to remove the operating keyboard, and possibly the unit including the indicator unit, in the form of the operating module, from the control device and to exchange it for a new operating module with a new keyboard and indicator, whilst the emergency control formed by the emergency cut-out switch remains connected to the circuit, so that during this exchange the support frame controlled by the control device can continue to operate, so that during the exchange of the keyboard it is not necessary to shut down completely, only that no new manually inserted control commands can be received.

Preferably the exchangeable modules are arranged in separate module housings. Advantageously the exchangeable modules are accommodated sealed in their module housings. The exchangeable modules are thus also reliably protected from dirt and moisture when they are removed from the casing of the control device or before they are installed in it. Advantageously, the plug-in connecting elements are encapsulated in their module housings.

Preferably the plug-in connecting elements for the operating module and/or the emergency cut-out module comprise multi-pole connectors arranged on their rear side or the rear side of the module housing, which can be connected to plug-in or socket connectors provided in the casing or to the circuit. The arrangement can be made such that the multi-pole connectors mate with the plug-in connectors on insertion of the exchangeable module into the casing of the control device; it is, however, also possible to provide connecting cabling between the multi-pole connectors on the exchangeable modules and the corresponding plug-in connectors in the casing or to the circuit, which is long enough to allow the operating module or the emergency cut-out module or another exchangeable module to be fully removed from the device casing without interrupting the connection to the electrical or electronic circuit, so that within a few seconds a new operating or emergency cut-out module can be connected to the connecting cable and permit the input of control commands manually before the individual exchangeable module is again completely installed in the casing.

Advantageously, the exchangeable modules can be retained in the casing by means of screws. Preferably protective caps are provided for the socket connectors in the casing and on the circuit, which can be put onto the socket connectors when the exchangeable modules are removed, so that they cannot become dirty, which could, for instance, be the case if the operating module is removed but not immediately replaced by a new exchangeable module, but the control equipment is operated over a certain period without the possibility of the manual input of control commands. Advantageously, the protective caps are secured by means of a simple retaining band or similar in the casing, so that they cannot fall out and are always kept available for when a module is removed from the equipment casing.

In an advantageous embodiment of the invention, the casing comprises a casing frame, open at the front and rear, into which can be inserted from the rear a circuit module accommodating the circuit and having on its rear side the plug-in connectors for the control leads, and into which the operating module and/or the emergency cut-out module can be inserted from the front. In this configuration the circuit itself is also configured as an exchangeable module and can be removed from the rear of the casing independently of the operating module and/or the emergency cut-out module.

Preferably, abutment elements are provided in the casing or casing frame for the positioning of the exchangeable modules, in order to provide a correct seating for the various exchangeable modules. Advantageously, the abutment elements for the exchangeable modules exchangeable from the front side of the control device comprise abutment rails running between the sides of the casing, with threaded bores for the fastening screws. In order to facilitate an especially simple removal of an exchangeable module, advantageously, the exchangeable modules are provided with handles or similar, by which they can be easily grasped after loosening of the fastening screws.

BRIEF DESCRIPTION OF THE DRAWINGS

Examples of control devices made in accordance with the present invention will now be described with reference to the accompanying drawings, in which.

DETAILED DESCRIPTION OF THE INVENTION

Figure 1:
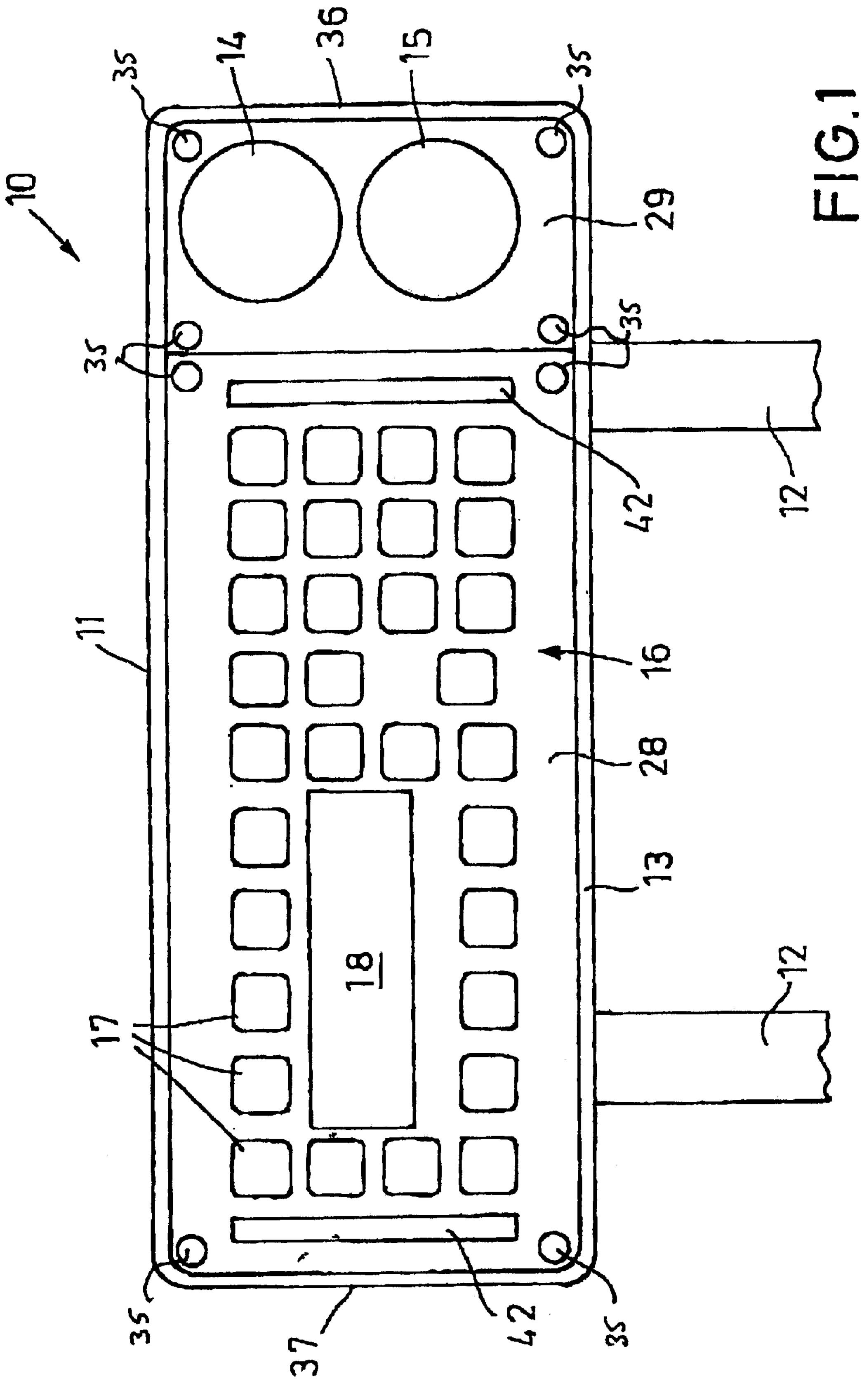
FIG. 1 shows a front elevation of a control device.

A control device 10 for electro-hydraulic support frame control in underground mining has a casing 11 of stainless steel, which is arranged with two indicated, carriers 9 not shown in detail, for instance on the roof cap of a support frame.

The casing 11 comprises a closed casing frame 12, closed above, below and on the casing side parts. The manually actuated control elements 13 of the control device 10 are accessible from the front side of the casing 11 shown in FIG. 1, being two switches 14, 15 for the emergency cut-out control of the support frame in the right-hand half, and in the region lying to the left of this a keyboard 16 with operating keys 17 to initiate the various functions of the support frame and an indicator unit 18, which displays the various operating conditions of the support frame.

Figure 2:
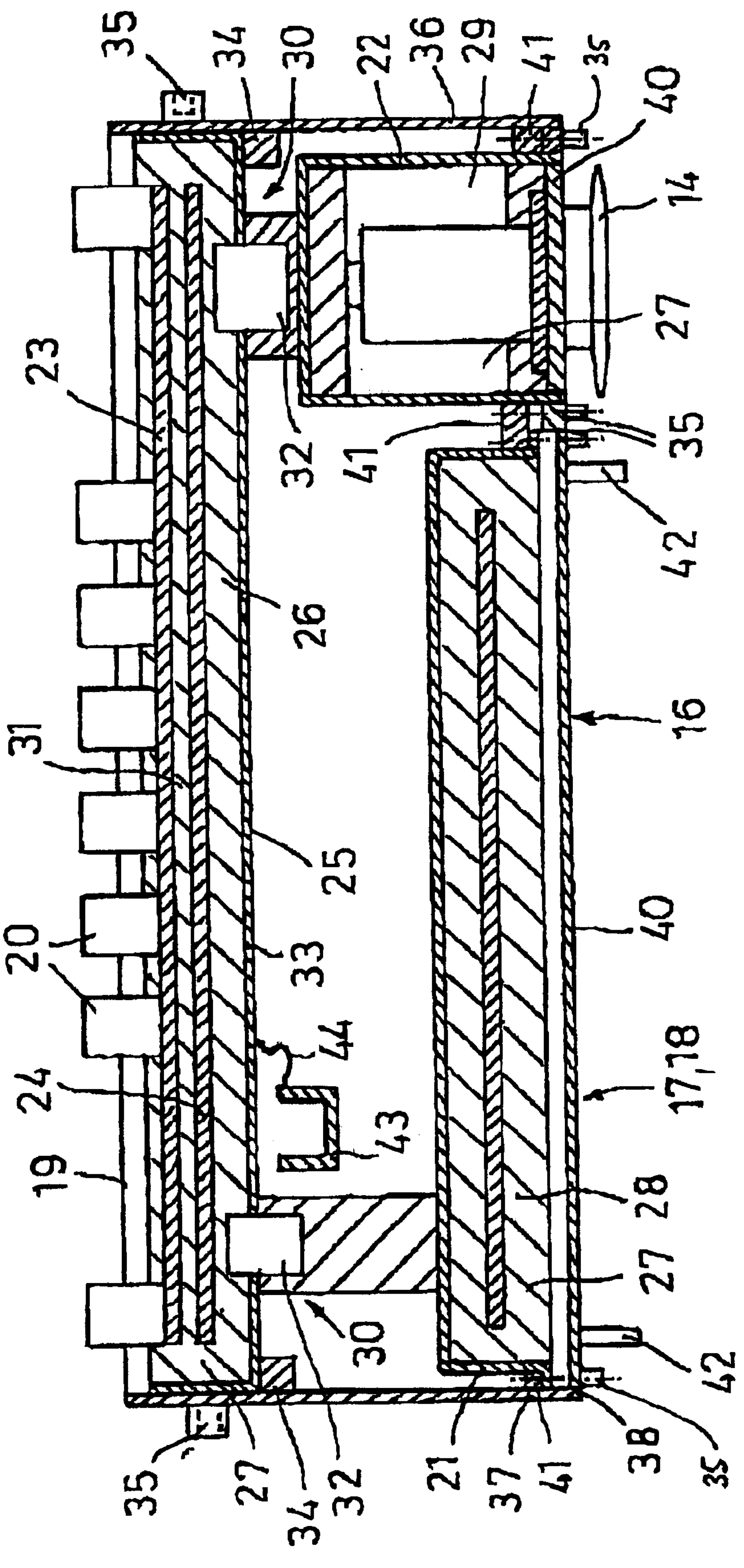
FIG. 2 shows a schematic representation of a cross section of the control device according to FIG. 1.

In FIGS. 1 and 2, several plug connectors 20 are provided on the rear side 19 of the casing 11, to which control leads for the components of the support frame to be controlled can be connected.

As shown in FIG. 2, the various actuated control elements, that is on the one hand the switches 14 and 15 provided for the emergency cut-out circuit and on the other the keyboard 16 with the operating keys 17 and the indicator unit 18 are arranged in separate module housings 21, 22 and sealed therein. In a similar fashion the plug connectors 20, together with the electronic circuit 24 for the control device 10 are accommodated in a third module housing 25 and are encapsulated therein by a cast block 26. The three module housings 21, 22, 25 with the components of the control device 10 accommodated in them form exchangeable modules 27, which can be removed from the casing frame 12 and exchanged for a new module, independently of each other.

The operating module 28 and the emergency cut-out module 29 are electrically connected via plug-in connecting elements 30 on the rear side of their housings 21, 22 to the circuit module 31. In the embodiment shown in FIG. 2 the plug-in connecting elements 30 comprise multi-pole plugs 32 arranged on the rear side of the modules 28, 29, 31 which, when the modules 28, 29, 31 are assembled, are inserted into socket connectors provided on the front side 33 of the circuit module 31.

The three exchangeable modules 27 of the control device 10 can be retained in the casing frame 12 by means of screws 35. The circuit module 31 is inserted from behind, that is from the rear side 19 of the casing 11, into the casing frame 12, until its front side 33 lies against a surrounding abutment rail 34 arranged to project inwards in the casing frame 12. In this position the circuit module 31 can be secured by means of fastening screws 35, which are screwed through the casing side parts 36, 37 into the module housing 25 of the circuit module 31.

The parts of the control device which wear out more rapidly than the circuit module, as a result of inappropriate and rough handling, namely the operating module 28 and the emergency cut-out module 29, are accessible from the front side 38 of the casing 11 and can be exchanged. They are fastened by screws 35, which are accessible from the front, and which are inserted through front side flanges 40 on the operating module 28 and the emergency cut-out module 29 and screwed into fastening rods 41, which are welded in between the upper and lower sides of the casing frame 12 in the casing 11 along the side parts of the casing 36, 37 and between the two exchangeable modules 27.

The various exchangeable modules 27, especially the operating module 28 or the emergency cut-out module 29, can be removed with very little effort from the casing 11 of the control device 10, without the need for a complete disassembly of the control device 10, whereas in the previously proposed devices all the connecting leads must be first removed from the plug connectors 20 and the device removed from the support frame. In the control device 10 according to the present invention, it is necessary, for instance for the exchange of the operating module 28, only to loosen the front fastening screws 35 and to withdraw the module 28 forwards from the casing frame 12. In order to facilitate this, the operating module 28 has two handles 42 to the right and left alongside its keyboard 16 on its front side, by which it can easily be grasped and drawn out from the casing 11. In this way, the multi-pole plug 32 is drawn out of the connecting socket on the circuit module 31, which is readily possible, even when the support frame controlled by the control device 10 is not set to a standstill, but continues to be operated. Following the complete removal of the operating module 28 from the casing 11, a new module 28 can be fitted. Since the associated support frame is not necessarily directed via the keyboard 16, but also can often be controlled by the control device of a neighbouring support frame (neighbourhood control), it is possible also to repair the operating module 28 and to install it again later. So as, in this instance, to prevent the socket connector for the operating module on the front side 33 of the circuit module 31 becoming dirty, a protective cap 43 is positioned close to the socket connector with a retaining band 44 on the front side 33 of the circuit module 31, which is put onto the socket connector following the disassembly of the operating module 28, and protects it safely against moisture and dirt.

Similarly, the emergency cut-out module 29 can also be removed from the casing 11 from the front, after the associated fastening screws 35 have been loosened. Since the large emergency cut-out switches 14, 15 can be readily grasped about their periphery, additional handles can be dispensed with for the emergency cut-out module 29.

Figure 3:
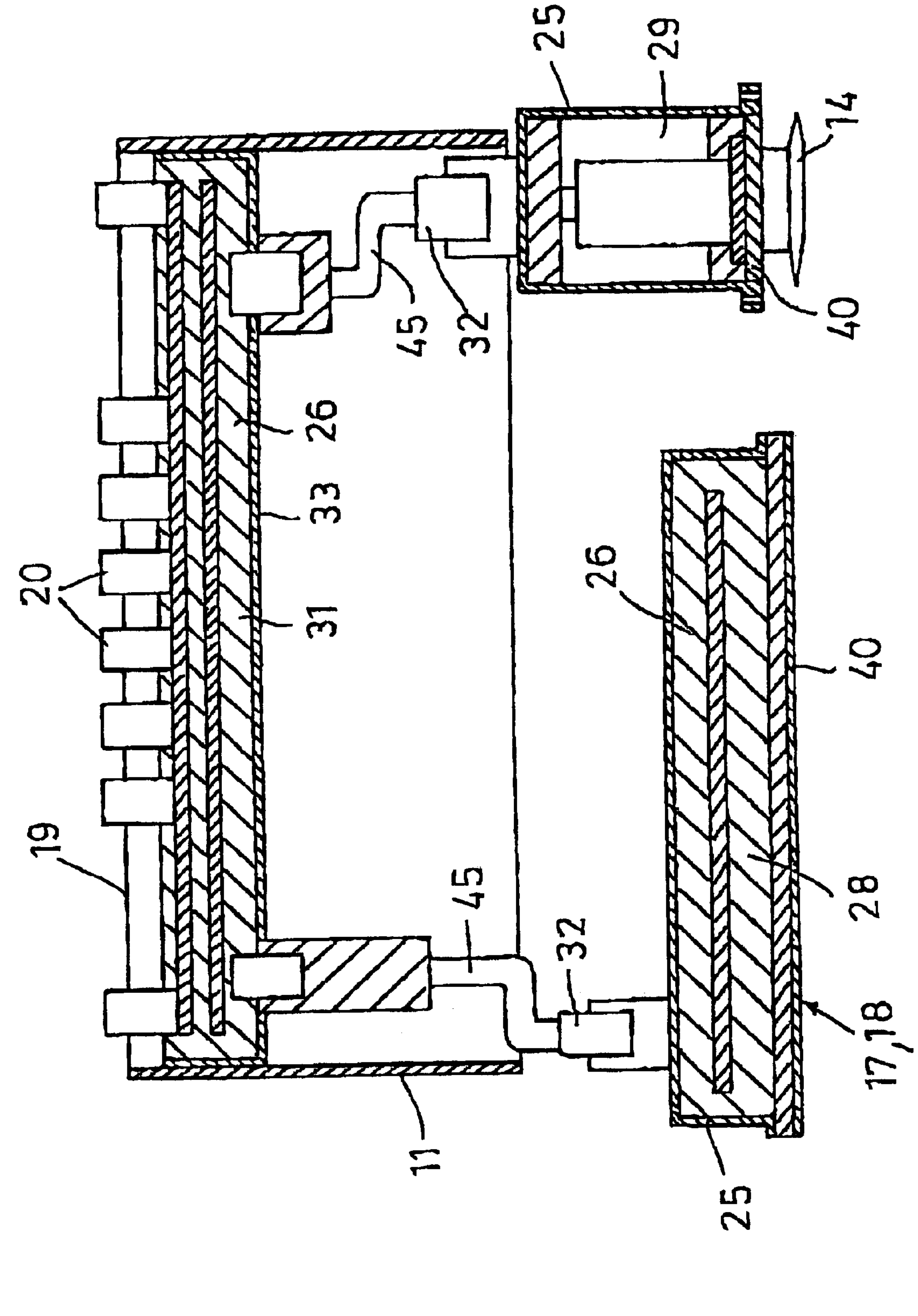
FIG. 3 shows a partially exploded cross-section of a second embodiment of the control device.

FIG. 3 shows a second embodiment of the control device, in which the plug connection between the operating and emergency cut-out modules 28, 29 on the one hand and the circuit module 31 on the other hand is not accomplished via multi-pole plugs arranged directly on the modules 28, 29, 31, but in which between the circuit module 31 on the one hand and the operating module 28 or the emergency cut-out module 29 on the other hand, cable connectors 45 are provided, which permit the operating module 28 and the emergency cut-out module 29 to be removed from the casing 11, without interrupting the electrical connection to the circuit module 31. In this embodiment full functional capability of the control device 10 thus remains, with the possibility of an input of control commands via the keyboard 16 and the actuation of the emergency cut-out switch 14, 15 when the modules 28, 29 are already removed from the casing 11, and is only interrupted for the few seconds which are required to remove the plug connection between the cable 45 and the socket connector or the multi-pole plug 32 and to connect on a new module 28, 29. This also has the advantage that the full functional capability of the new replacement module 28, 29 can be tested before it is inserted in the casing 11 and secured there by the fastening screws 35.

The invention is not limited to the embodiments shown and described herein as many modifications are possible, which do not depart from the scope of the invention. It is thus conceivable, not to arrange the keyboard 16 and the indicating unit 18 in one operating module, but to divide them between two or more modules, if this is more practical for a particular case. Also, since the circuit module 31 is subjected to practically no wear due to operation, and therefore normally works for a long period without difficulties, it is possible in a simplified modification of the control device according to the invention to configure the circuit module 31 as non-exchangeable, and to integrate the complete circuit 24 with the plug connectors 20 fixed in the casing. The fastening of the exchangeable modules 27 in the casing 11 can, instead of with the fastening screws 35, also be effected by suitable connector retaining elements such as, for instance plug staples or similar, when contamination of the dirt-sensitive threads of the fastening screws with coal dust or similar has to be minimised to inhibit their becoming difficult to operate.

We claim:

1. Electro-hydraulic mining equipment equipped with a control device, with a casing accommodating the electrical and/or electronic circuit of the control device, several plug connectors accessible from the outside of the casing for the connection of control leads for one or more components of the mining equipment to be controlled, a plurality of actuating control elements being connected to said circuit, which can be actuated, in which the actuating control elements and/or said circuit of the control device are grouped together and accommodated in the casing in several exchangeable modules, which when assembled in the casing are connected together by means of plug-in connecting elements and which are exchangeable within the casing independently of each other.

2. Electro-hydraulic mining equipment equipped with a control device, according to claim 1, in which a first exchangeable module is configured as an operating module, having an operating keyboard and a second exchangeable module is configured as an emergency cut-out module.

3. Electro-hydraulic mining equipment equipped with a control device, according to claim 1, in which the first exchangeable module has an indicator unit in addition to an operating keyboard.

4. Electro-hydraulic mining equipment equipped with a control device, according to claim 1, in which the exchangeable modules are arranged in separate module housings.

5. Electro-hydraulic mining equipment equipped with a control device, according to claim 1, in which the exchangeable modules are accommodated sealed in their module housings.

6. Electro-hydraulic mining equipment equipped with a control device, according to claim 1, in which the plug-in connecting elements or plug connectors are encapsulated in their module housings.

7. Electro-hydraulic mining equipment equipped with a control device, according to claim 2, in which the plug-in connecting elements for the operating module and/or the emergency cut-out module comprise multi-pole connectors arranged on their rear side or their module housing rear side, which can be connected to socket or plug-in connectors provided in the casing or on the circuit of the control device.

8. Electro-hydraulic mining equipment equipped with a control device, according to claim 1, in which the exchangeable modules can be retained in the casing by means of screws.

9. Electro-hydraulic mining equipment equipped with a control device, according to claim 7, in which, protective caps are provided for the socket connectors in the casing and on the circuit, which can be put onto the socket connectors when the exchangeable modules are removed.

10. Electro-hydraulic mining equipment equipped with a control device, according to claim 9, in which the protective caps are secured by means of a retaining band or similar in the casing.

11. Electro-hydraulic mining equipment equipped with a control device, according to claim 1, in which the casing comprises a casing frame, open at the front and rear, into which can be inserted from the rear a circuit module accommodating the circuit and having on its rear side the plug-in connectors for the control leads, and into which the operating module and/or the emergency cut-out module can be inserted from the front.

12. Electro-hydraulic mining equipment equipped with a control device, according to claim 1, in which in the casing or a casing frame, abutment elements are provided for the positioning of the exchangeable modules.

13. Electro-hydraulic mining equipment equipped with a control device, according to claim 12, in which abutment elements for the exchangeable modules exchangeable from the front side of the control device comprise abutment rails, running between the sides of the casing, with threaded bores for the fastening screws.

14. Electro-hydraulic mining equipment equipped with a control device, according to claim 1, in which the exchangeable modules are provided with handles.

15. Electro-hydraulic mining equipment equipped with a control device, with a casing accommodating the electrical and/or electronic circuit of the control device, several plug connectors accessible from the outside of the casing for the connection of control leads for one or more components of the mining equipment to be controlled, a plurality of actuating control elements being connected to said circuit, which can be actuated, in which the actuating control elements and/or said circuit of the control device are grouped together and accommodated in the casing in several exchangeable modules, which when assembled in the casing are connected together by means of plug-in connecting elements and which are exchangeable within the casing independently of each other, in which the exchangeable modules arc accommodated sealed in their module housings.

16. Electro-hydraulic mining equipment equipped with a control device, with a casing accommodating the electrical and/or electronic circuit of the control device, several plug connectors accessible from the outside of the casing for the connection of control leads for the one or more components of the mining equipment to be controlled, a plurality of actuating control elements being connected to said circuit, which can be actuated, in which the actuating control elements and/or said circuit of the control device are grouped together and accommodated in the casing in several exchangeable modules, which when assembled in the casing are connected together by means of plug-in connecting elements and which are exchangeable within the casing independently of each other, in which the plug-in connecting elements or plug connectors are encapsulated in their module housings.

* * * * *